(12) United States Patent
Lee

(10) Patent No.: US 6,567,321 B2
(45) Date of Patent: May 20, 2003

(54) SEMICONDUCTOR MEMORY DEVICE USING DEDICATED COMMAND AND ADDRESS STROBE SIGNAL AND ASSOCIATED METHOD

(75) Inventor: Dong-Yang Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/955,420

(22) Filed: Sep. 17, 2001

(65) Prior Publication Data

US 2002/0085430 A1 Jul. 4, 2002

(30) Foreign Application Priority Data

Sep. 16, 2000 (KR) ........................................ 2000-54431

(51) Int. Cl.$^7$ ................................................. G11C 7/00
(52) U.S. Cl. ........................................ 365/193; 365/233
(58) Field of Search ................................. 365/193, 233

(56) References Cited

U.S. PATENT DOCUMENTS 5,805,901 A * 9/1998 Dornier et al. ............. 395/733
6,064,625 A * 5/2000 Tomita ........................ 365/233
6,091,663 A * 7/2000 Kim et al. ................... 365/233
6,285,625 B1 * 9/2001 Vogley ........................ 365/233

* cited by examiner

Primary Examiner—David Nelms
Assistant Examiner—Tu-Tu Ho

(57) ABSTRACT

Provided is a synchronous DRAM capable of reducing latency corresponding to a time difference between the arrival of commands and addresses and the arrival of a system clock. The synchronous DRAM safely transmits the commands and addresses to all the synchronous DRAMs of a memory module within a clock cycle time even when the frequency of the system clock increases. An associated method is additionally provided. The synchronous DRAM receives a dedicated command and address strobe signal, different than the system clock. The dedicated command and address strobe signal allows safe transmission of the commands and addresses to all synchronous DRAMs of a memory module regardless of the frequency of the system clock.

14 Claims, 2 Drawing Sheets

SEMICONDUCTOR MEMORY DEVICE USING DEDICATED COMMAND AND ADDRESS STROBE SIGNAL AND ASSOCIATED METHOD

BACKGROUND OF THE INVENTION

1. Field of the Invention

The present invention relates to a semiconductor memory device, and, more particularly, to a synchronous DRAM including a dedicated strobe signal used only for commands and addresses and an associated method.

2. Description of the Related Art

To improve system performance, the integration and speed of semiconductor memory devices, in particular, DRAMs is continuously increasing. Notwithstanding these continuous advancements, a DRAM capable of processing more data at higher speed is necessary. Accordingly, a synchronous DRAM that operates synchronous with a system clock has been developed for high speed operation. The transmission speed of data has significantly increased with the appearance of the synchronous DRAM.

In the conventional synchronous DRAM, the input and output of data are synchronous with a system clock. Commands and addresses are input responsive to a system clock. Accordingly, the commands and addresses must be transmitted from a memory controller to the synchronous DRAM within a predetermined cycle time of the system clock. Even though the commands and addresses arrive at the synchronous DRAM before the system clock, the commands and addresses are provided internally responsive to the arrival of the system clock. Therefore, the latency corresponding to the time difference between the arrival of the commands and addresses and the arrival of the system clock increases in the conventional synchronous DRAM. Also, when the cycle time of the system clock is reduced because of increased system clock frequency, it is difficult to transmit commands and addresses to all synchronous DRAMs in a memory module within a single clock cycle time in a memory module having multiple synchronous DRAMs.

SUMMARY OF THE INVENTION

It is an object of the invention to overcome the disadvantages associated with conventional synchronous DRAMS.

It is another object of the present invention to provide a synchronous DRAM that is capable of reducing a latency associated with a time difference between the arrival of commands and addresses and the arrival of a system clock and safely transmitting the commands and addresses to all the synchronous DRAMs of a memory module within a clock cycle time even when the frequency of the system clock increases.

It is yet another object of the present invention to provide a method of inputting commands and addresses that is capable of reducing the latency corresponding to a time difference between the arrival of commands and addresses and the arrival of a system clock and safely transmitting the commands and addresses to all the synchronous DRAMs of a memory module within a clock cycle time even when the frequency of the system clock increases.

A semiconductor memory device operating responsive to a system clock is provided. The device includes a strobe signal input buffer circuit for receiving a dedicated command and address strobe signal. A command input buffer circuit receives commands responsive to an output signal of the strobe signal input buffer circuit and latches the received commands. An address input buffer circuit receives addresses responsive to the output signal of the strobe signal input buffer circuit and latches the received addresses. The dedicated command and address strobe signal is different from the system clock.

In one embodiment, the dedicated command and address strobe signal is activated only when the commands and the addresses are input to the semiconductor memory device. In another embodiment the dedicated command and address strobe signal is a free running clock that continuously toggles.

A method of inputting commands and addresses responsive to a system clock is provided. The method includes receiving a dedicated command and address strobe signal, receiving commands responsive to the reference edge of the dedicated command and address strobe signal, and latching the received commands. The method further includes receiving addresses responsive to the reference edge of the dedicated command and address strobe signal and latching the received addresses, wherein the dedicated command and address strobe signal is different from the system clock.

In one embodiment, the dedicated command and address strobe signal is activated only when the commands and the addresses are input to the semiconductor memory device. In another embodiment, the dedicated command and address strobe signal is a free running clock that continuously toggles.

BRIEF DESCRIPTION OF THE DRAWINGS

The above objects and advantages of the present invention will become more apparent by describing in detail a preferred embodiment with reference to the attached drawings.

DESCRIPTION OF THE PREFERRED EMBODIMENT

Figure 1:
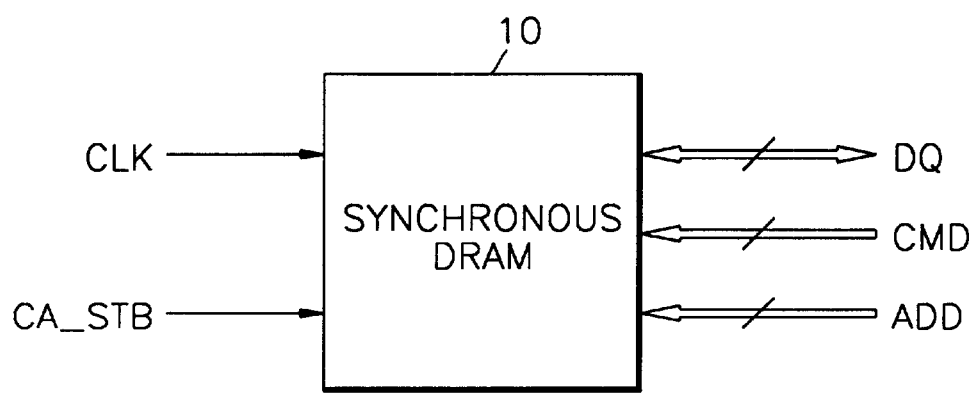
FIG. 1 is a schematic block diagram of a synchronous DRAM according to the present invention.

The present invention will now be described more fully with reference to the accompanying drawings in which preferred embodiments of the invention are shown. Same reference numerals are used to denote the same elements throughout the drawings.

FIG. 1 is a schematic block diagram of a synchronous semiconductor memory device according to the present invention. Referring to FIG. 1, a synchronous DRAM 10 receives input and output of data DQ synchronous with a system clock (CLK). Commands CMD and addresses ADD are input responsive to a dedicated command and address strobe signal CA_STB.

The dedicated command and address strobe signal CA_STB is different from the system clock CLK and is only used for strobing commands CMD and addresses ADD. The dedicated command and address strobe signal CA_STB does not participate in the internal operation of the synchronous DRAM 10 nor in the input and output of the data DQ. The dedicated command and address strobe signal participates only in the input and decoding of the commands CMD and the addresses ADD.

The commands CMD and the addresses ADD are provided, for example, by a memory controller (not shown)

for controlling the synchronous DRAM 10. The dedicated command and address strobe signal CA_STB is provided, for example, by the memory controller or any other predetermined circuit.

Figure 2:
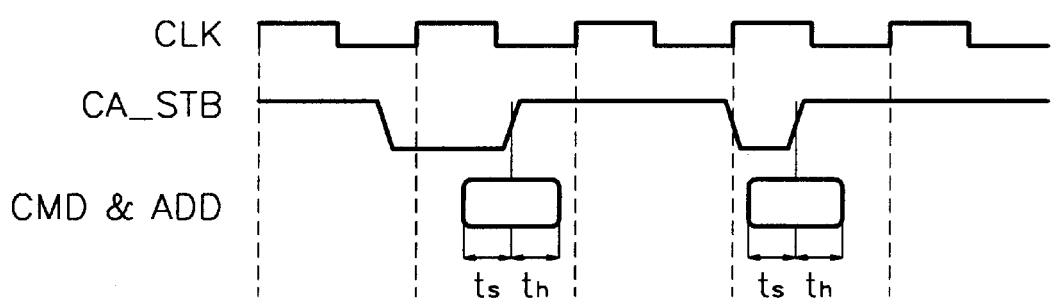
FIG. 2 is a timing diagram of the respective signals of the synchronous DRAM shown in FIG. 1.

FIG. 2 is a timing diagram of the respective signals of the synchronous DRAM shown in FIG. 1. Referring to FIG. 2, the dedicated command and address strobe signal CA_STB is activated only when the commands CMD and the addresses ADD are input to the synchronous DRAM 10. Alternatively, a free running clock, that continuously toggles, can be used as the dedicated command and address strobe signal CA_STB.

A reference edge of the dedicated command and address strobe signal CA_STB, latches the commands CMD and the addresses ADD to the synchronous DRAM. The reference edge occurs between first and second edges of the system clock CLK.

In FIG. 2, the reference edge of the dedicated command and address strobe signal CA_STB is a rising edge and the DRAM 10 operates responsive to a rising edge of the system clock CLK. '$t_s$' denotes the set-up time of the commands CMD and the addresses ADD. '$t_h$' denotes the hold time of the commands CMD and the addresses ADD. In this case, the commands CMD and the addresses ADD are provided to the synchronous DRAM responsive to the rising edge of the dedicated command and address strobe signal CA_STB.

Alternatively, the reference edge of the dedicated command and address strobe signal CA_STB can be a falling edge (not shown). In this case, the commands CMD and the addresses ADD are provided to the synchronous DRAM responsive to the falling edge of the dedicated command and address strobe signal CA_STB.

When the synchronous DRAM 10 operates responsive to the falling edge of the system clock CLK, the reference edge of the dedicated command and address strobe signal CA_STB must occur between a predetermined falling edge of the system clock CLK and the next falling edge of the system clock CLK. Alternatively, if the synchronous DRAM 10 operates responsive to both the rising edge and the falling edge of the system clock CLK, the reference edge of the dedicated command and address strobe signal CA_STB must occur between a predetermined falling edge of the system clock CLK and the next rising edge of the system clock CLK, or between a predetermined rising edge of the system clock CLK and the next falling edge of the system clock CLK.

Figure 3:
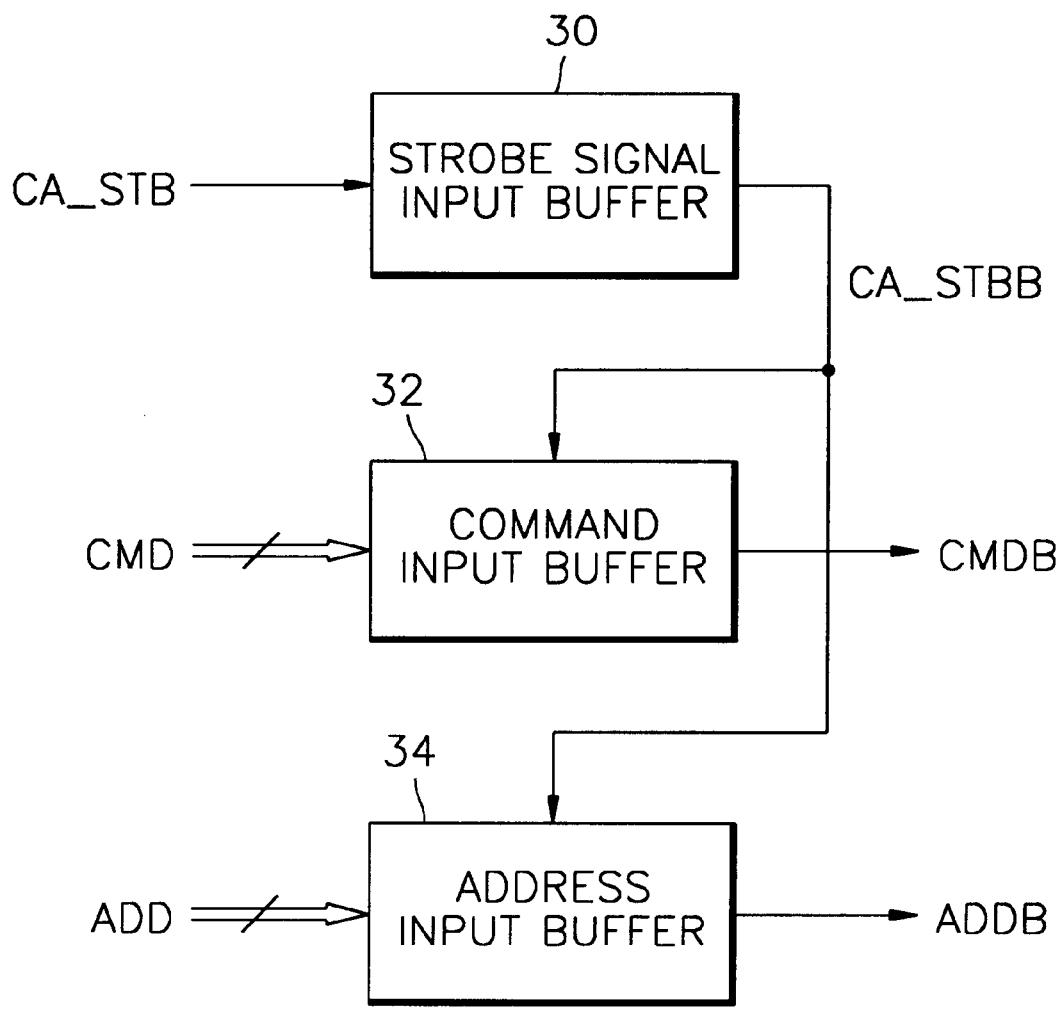
FIG. 3 is a block diagram of a circuit for inputting commands and addresses to the synchronous DRAM shown in FIG. 1.

FIG. 3 is a block diagram of a circuit for inputting the commands and addresses of the synchronous DRAM shown in FIG. 1. Referring to FIG. 3, the circuit for inputting the commands and addresses of the synchronous DRAM includes a strobe signal input buffer circuit 30, a command input buffer circuit 32, and an address input buffer circuit 34.

The strobe signal input buffer circuit 30 receives the dedicated command and address strobe signal CA_STB, buffers the received signal, and outputs the buffered signal CA_STBB. The command input buffer circuit 32 receives the commands CMD responsive to the signal CA_STBB and latches the received commands as CMDB. The address input buffer circuit 34 receives the addresses ADD responsive to the output signal CA_STBB and latches the received addresses as ADDB. The buffered commands CMDB and addresses ADDB are transmitted to the internal circuits of the synchronous DRAM (not shown).

In the synchronous DRAM according to the present invention, the internal operation and the input and output of data are performed synchronous to the system clock CLK.

However, the commands CMD and the addresses ADD are input responsive to the dedicated command and address strobe signal CA_STB.

Therefore, it is possible to safely transmit the commands and addresses to all the synchronous DRAMs of a memory module regardless of the frequency of the system clock CLK. Also, even though the frequency of the system clock CLK increases, since the commands CMD and the addresses ADD are correctly input responsive to the dedicated command and address strobe signal CA_STB, that is not related to the system clock CLK, latency corresponding to a time difference between the arrival of the commands and addresses and the arrival of the system clock is reduced.

In the drawings and specification, typical preferred embodiments of the invention have been disclosed and, although specific terms are employed, they are used in a generic and descriptive sense only and not for purposes of limitation, the scope of the invention being set forth in the following claims. Therefore, it will be understood by those skilled in the art that various changes in form and details may be made to the preferred embodiments described herein without departing from the spirit and scope of the invention as defined by the appended claims.

I claim:

1. A semiconductor memory device operating responsive to a system clock, comprising:

a strobe signal input buffer circuit adapted to buffer a dedicated command and address strobe signal;

a command input buffer circuit adapted to latch commands responsive to the buffered dedicated command and address signal; and an address input buffer circuit adapted to latch addresses responsive to the buffered dedicated command and address signal, wherein the dedicated command and address strobe signal is asynchronous from the system clock.

2. The semiconductor memory device of claim 1 wherein the dedicated command and address strobe signal is active only when the commands and the addresses are provided to the semiconductor memory device.

3. The semiconductor memory device of claim 1 wherein the dedicated command and address strobe signal is a free running clock that continuously toggles from a first state to a second state.

4. The semiconductor memory device of claim 1 wherein a reference edge of the dedicated command and address strobe signal occurs between a predetermined rising edge of the system clock and the next rising edge of the system clock.

5. The semiconductor memory device of claim 1 wherein a reference edge of the dedicated command and address strobe signal occurs between a predetermined falling edge of the system clock and the next falling edge of the system clock.

6. The semiconductor memory device of claim 1 wherein a reference edge of the dedicated command and address strobe signal occurs between a predetermined falling edge of the system clock and the next rising edge of the system clock.

7. The semiconductor memory device of claim 1 wherein a reference edge of the dedicated command and address strobe signal occurs between a predetermined rising edge of the system clock and the next falling edge of the system clock.

8. A method of inputting commands and addresses to semiconductor device operating responsive to a system clock, comprising:

receiving a dedicated command and address strobe signal asynchronous to the system clock;

latching commands responsive to a reference edge of the dedicated command and address strobe signal; and latching addresses responsive to the reference edge of the dedicated command and address strobe signal.

9. The method of claim 8 including activating the dedicated command and address strobe signal only when the commands and the addresses are provided to the semiconductor memory device.

10. The method of claim 8 setting the dedicated command and address strobe signal as a free running clock that continuously toggles from a first to a second state.

11. The method of claim 8 including activating the reference edge of the dedicated command and address strobe signal between a predetermined rising edge of the system clock and the next rising edge of the system clock.

12. The method of claim 8 including activating the reference edge of the dedicated command and address strobe signal between a predetermined falling edge of the system clock and the next falling edge of the system clock.

13. The method of claim 8 including activating the reference edge of the dedicated command and address strobe signal between a predetermined falling edge of the system clock and the next rising edge of the system clock.

14. The method of claim 8 including activating the reference edge of the dedicated command and address strobe signal between a predetermined rising edge of the system clock and the next falling edge of the system clock.

* * * * *